(12) United States Patent
Pham et al.

(10) Patent No.: US 12,543,382 B2
(45) Date of Patent: Feb. 3, 2026

(54) TOPCon SOLAR CELL AND METHOD FOR MANUFACTURING THE SAME

(71) Applicant: Research & Business Foundation Sungkyunkwan University, Suwon-si (KR)

(72) Inventors: Duy Phong Pham, Suwon-si (KR); Seung Yong Han, Suwon-si (KR); Young Kuk Kim, Suwon-si (KR); Jun Sin Yi, Suwon-si (KR)

(73) Assignee: RESEARCH & BUSINESS FOUNDATION SUNGKYUNKWAN UNIVERSITY, Suwon-si (KR)

( * ) Notice: Subject to any disclaimer, the term of this patent is extended or adjusted under 35 U.S.C. 154(b) by 0 days.

(21) Appl. No.: 18/792,865

(22) Filed: Aug. 2, 2024

(65) Prior Publication Data
US 2025/0048747 A1    Feb. 6, 2025

(30) Foreign Application Priority Data
Aug. 4, 2023  (KR) .................. 10-2023-0102488

(51) Int. Cl.
*H10F 10/165*  (2025.01)
*H10F 71/00*   (2025.01)
*H10F 77/122*  (2025.01)
*H10F 77/30*   (2025.01)

(52) U.S. Cl.
CPC ......... *H10F 10/165* (2025.01); *H10F 71/121* (2025.01); *H10F 77/122* (2025.01); *H10F 77/315* (2025.01)

(58) Field of Classification Search
None
See application file for complete search history.

(56) References Cited

U.S. PATENT DOCUMENTS 10,707,368 B2    7/2020  Peibst

FOREIGN PATENT DOCUMENTS

| CN | 115394863 A | * | 11/2022 | ........... H10F 10/165 |
|---|---|---|---|---|
| KR | 10-2011-0074248 A | | 6/2011 | |
| KR | 10-2017-0095004 A | | 8/2017 | |
| KR | 10-2018-0050171 A | | 5/2018 | |
| KR | 10-2087813 B1 | | 3/2020 | |
| KR | 10-2020-0109770 A | | 9/2020 | |

* cited by examiner

*Primary Examiner* — Dustin Q Dam
(74) *Attorney, Agent, or Firm* — LEX IP MEISTER, PLLC

(57) ABSTRACT

A Tunnel Oxide Passivated Contact (TOPCon) solar cell, and a method therefor are provided. The TOPCon solar cell includes: a silicon substrate; a tunneling layer formed on a surface of the silicon substrate; a polycrystalline silicon layer formed on a surface of the tunneling layer; a polycrystalline germanium layer formed on a surface of the polycrystalline silicon layer; a lower passivation layer formed on a surface of the polycrystalline germanium layer; and a lower electrode formed on the lower passivation layer and electrically connected to the polycrystalline germanium layer.

14 Claims, 3 Drawing Sheets

TOPCon SOLAR CELL AND METHOD FOR MANUFACTURING THE SAME

CROSS-REFERENCE TO RELATED APPLICATION(S)

This application claims the benefit under 35 USC § 119(a) of Korean Patent Application No. 10-2023-0102488 filed on Aug. 4, 2023, in the Korean Intellectual Property Office, the entire disclosures of which are hereby incorporated by reference for all purposes.

BACKGROUND

1. Field

The present invention relates to a Tunnel Oxide Passivated Contact (TOPCon) solar cell and a method for manufacturing the same, and more specifically, to a TOPCon solar cell and a method for manufacturing the same, which can reduce manufacturing costs while enhancing photoelectric efficiency.

2. Description of the Related Art

Global warming and environmental pollution are accelerating due to emission of carbon dioxide and pollutants generated as the world's dependence on fossil fuels increases. In order to solve this problem, research on new renewable energy sources such as solar energy, wind power, hydroelectric power, and geothermal heat has been actively conducted.

Among the renewable energy sources, a solar cell is a photoelectric energy conversion system that converts light energy emitted from the sun into electrical energy, and generates current and voltage by using a photovoltaic effect that generates electrons and holes by absorbing light energy from sunlight. The solar cell is largely classified into a silicon solar cell, a compound semiconductor solar cell, and a stack-type solar cell according to raw materials, and the mainstream among the solar cells is the silicon solar cell.

The silicon solar cell includes an anti-reflective layer for reducing light reflection and absorbing light well, a silicon wafer including a P-N junction, an emitter, and a base, and a front electrode and a rear electrode for guiding electricity generated by light to an external circuit.

The front electrode and the rear electrode are formed of a conductive metal paste. In this case, silver (Ag) is most often used as a main material of the metal paste.

Silver (Ag) has an advantage of excellent electrical conductivity, but has a disadvantage of high cost. To solve this problem, lead-free glass frit powder using bismuth oxide ($Bi_2O_3$) has been introduced. However, the lead-free glass frit powder has a problem in that contact resistance between an electrode and a substrate is low.

Therefore, there is a need for a new method capable of manufacturing a solar cell with better performance than the related art while reducing an amount of silver used.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

The present disclosure is to provide a TOPCon solar cell and a method for manufacturing the same, which may form a polycrystalline silicon layer and a polycrystalline germanium layer between a tunneling layer and a lower passivation layer.

In a general aspect of the disclosure, a Tunnel Oxide Passivated Contact (TOPCon) solar cell includes: a silicon substrate; a tunneling layer formed on a surface of the silicon substrate; a polycrystalline silicon layer formed on a surface of the tunneling layer; a polycrystalline germanium layer formed on a surface of the polycrystalline silicon layer; a lower passivation layer formed on a surface of the polycrystalline germanium layer; and a lower electrode formed on the lower passivation layer and electrically connected to the polycrystalline germanium layer.

The polycrystalline germanium layer may have a thickness that is larger than a thickness of the polycrystalline silicon layer.

The polycrystalline silicon layer may have a thickness of 10 to 20 nm, and the polycrystalline germanium layer may have a thickness of 80 to 100 nm.

The polycrystalline silicon layer and the polycrystalline germanium layer may be formed by plasma-enhanced chemical vapor deposition.

The lower electrode may be partially inserted into the polycrystalline germanium layer by passing through the lower passivation layer.

The lower passivation layer may include a light-transmissive material.

The lower passivation layer may passivate defects present in at least one of a surface of the silicon substrate, a bulk of the silicon substrate, or a combination thereof.

The TOPCon solar cell may further include: an emitter layer formed on another surface of the silicon substrate; an anti-reflective layer formed on a surface of the emitter layer; an upper passivation layer formed on a surface of the anti-reflective layer; and an upper electrode formed on another surface of the upper passivation layer and having a predetermined grid shape.

The upper electrode may be partially inserted into the emitter layer by passing through the upper passivation layer and the anti-reflective layer.

The upper passivation layer may include a non-conductor having a light transmittance that is higher than a light transmittance of the anti-reflective layer.

The polycrystalline silicon layer may be formed by depositing a first source gas including at least one of monosilane, hydrogen, phosphine, or any combination thereof.

The polycrystalline germanium layer may be formed by depositing a second source gas including at least one of germane, hydrogen, phosphine, or any combination thereof.

In another general aspect of the disclosure, a Tunnel Oxide Passivated Contact (TOPCon) solar cell includes: a silicon substrate; a tunneling layer formed on a surface of the silicon substrate; an emitter layer formed on another surface of the silicon substrate; a polycrystalline silicon layer formed on a surface of the tunneling layer; an anti-reflective layer formed on a surface of the emitter layer; a polycrystalline germanium layer formed on a surface of the polycrystalline silicon layer; a lower passivation layer formed on a surface of the polycrystalline germanium layer; an upper passivation layer formed on a surface of the anti-reflective layer; a lower electrode formed on the lower passivation layer and electrically connected to the polycrystalline germanium layer; and an upper electrode formed on a surface of the upper passivation layer and having a predetermined grid shape.

The polycrystalline germanium layer may have a thickness that is larger than a thickness of the polycrystalline silicon layer.

The polycrystalline silicon layer may have a thickness of 10 to 20 nm, and the polycrystalline germanium layer may have a thickness of 80 to 100 nm.

In yet another general aspect of the disclosure, a method for manufacturing a Tunnel Oxide Passivated Contact (TOP-Con) solar cell, includes: preparing a silicon substrate; forming a tunneling layer on a surface of the silicon substrate; forming a polycrystalline silicon layer on a surface of the tunneling layer; forming a polycrystalline germanium layer on a surface of the polycrystalline silicon layer; forming a lower passivation layer on a surface of the polycrystalline germanium layer; and forming a lower electrode on a side of the lower passivation layer, wherein the lower electrode is electrically connected to the polycrystalline germanium layer.

In the forming of the polycrystalline germanium layer, the polycrystalline germanium layer may be formed with a thickness that is larger than a thickness of the polycrystalline silicon layer.

The polycrystalline silicon layer may have a thickness of 10 to 20 nm, and the polycrystalline germanium layer may have a thickness of 80 to 100 nm.

In the forming of the polycrystalline silicon layer, the polycrystalline silicon layer may be deposited on a surface of the tunneling layer by supplying a first source gas including at least one of monosilane, hydrogen, phosphine, or any combination thereof.

In the forming of the polycrystalline germanium layer, the polycrystalline germanium layer may be deposited on a surface of the polycrystalline silicon layer by supplying a second source gas including at least one of germane, hydrogen, phosphine, or any combination thereof.

According to the present disclosure, in the TOPCon solar cell, the polycrystalline silicon layer and the polycrystalline germanium layer may be formed between the tunneling layer and the lower passivation layer, thereby reducing a content of silver in the upper electrode and the lower electrode.

In addition, the content of silver in the upper electrode and the lower electrode may be reduced, thereby reducing manufacturing costs of the TOPCon solar cell.

DETAILED DESCRIPTION

Figure 1:
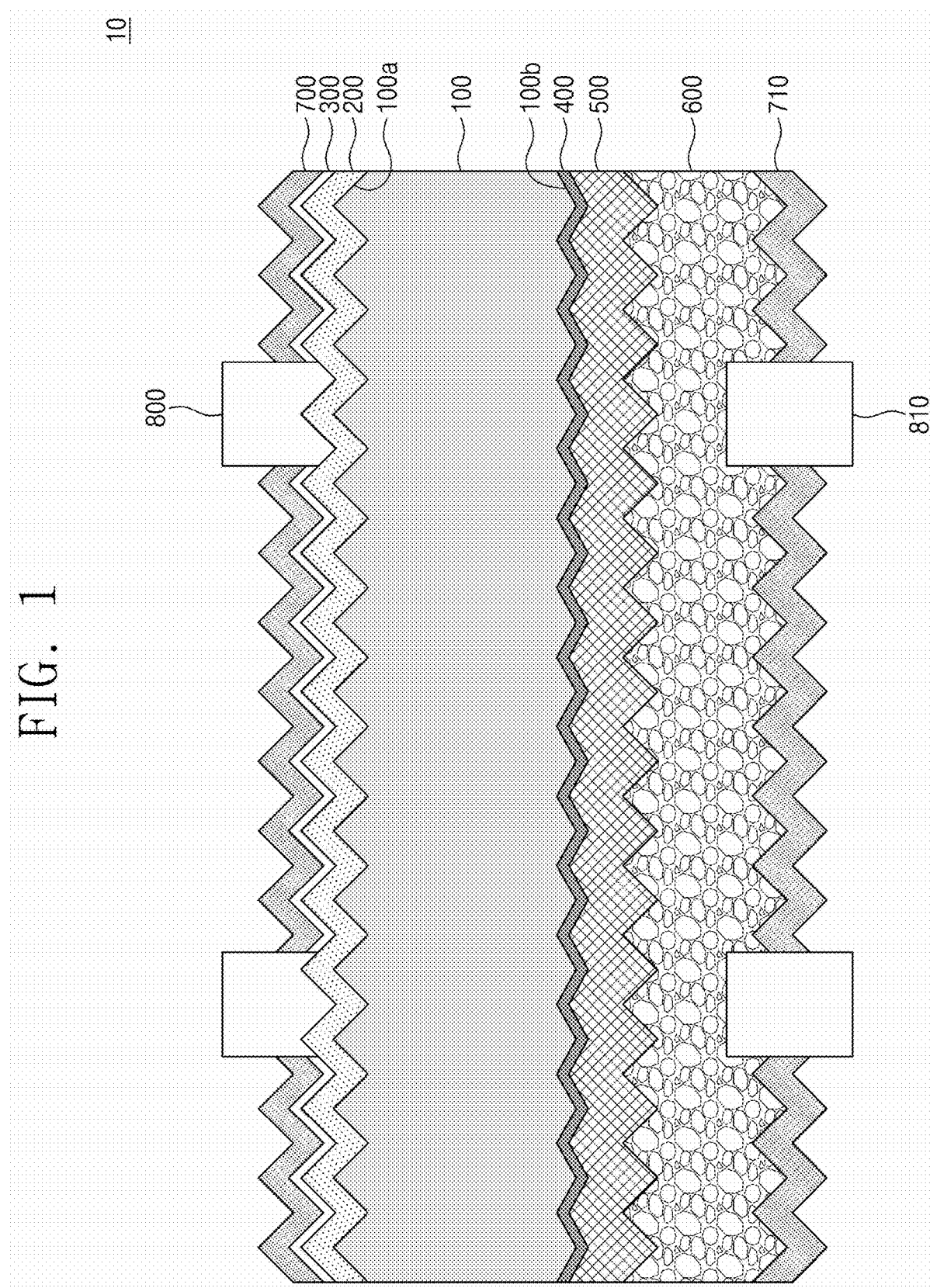
FIG. 1 is a view showing a TOPCon solar cell according to one embodiment of the present disclosure.

Hereinafter, preferred embodiments of the present invention will be described in detail with reference to the accompanying drawings. However, the present invention may be embodied in different forms and should not be construed as limited to the embodiments set forth herein. Rather, the embodiments introduced herein are provided so that the disclosed contents may be thorough and complete and the spirit of the present invention may be sufficiently conveyed to those skilled in the art.

In the present specification, it will be understood that when an element is referred to as being "on" another element, it can be formed directly on the other element or intervening elements may be present. In the drawings, the thicknesses of layers and regions are exaggerated for clarity.

In addition, it will be also understood that although the terms first, second, third, etc. may be used herein to describe various elements, these elements should not be limited by these terms. These terms are only used to distinguish one element from another element. Thus, a first element in some embodiments may be termed a second element in other embodiments without departing from the teachings of the present invention. Embodiments explained and illustrated herein include their complementary counterparts. As used herein, the term "and/or" includes any and all combinations of one or more of the associated listed elements.

The singular expression also includes the plural meaning as long as it does not differently mean in the context. In addition, the terms "comprise", "have" etc., of the description are used to indicate that there are features, numbers, steps, elements, or combination thereof, and they should not exclude the possibilities of combination or addition of one or more features, numbers, operations, elements, or a combination thereof. Furthermore, it will be understood that when an element is referred to as being "connected" or "coupled" to another element, it may be directly connected or coupled to the other element or intervening elements may be present.

In addition, when detailed descriptions of related known functions or constitutions are considered to unnecessarily cloud the gist of the present invention in describing the present invention below, the detailed descriptions will not be included.

FIG. 1 is a view showing a TOPCon solar cell according to one embodiment of the present invention.

Referring to FIG. 1, a Tunnel Oxide Passivated Contact (TOPCon) solar cell 10 is provided in a TOPCon structure capable of reducing manufacturing costs while enhancing photoelectric efficiency. The TOPCon solar cell 10 includes a silicon substrate 100, an emitter layer 200, an anti-reflective layer 300, a tunneling layer 400, a polycrystalline silicon (Poly-Si) layer 500, a polycrystalline germanium (Poly-Ge) layer 600, an upper passivation layer 700, a lower passivation layer 710, an upper electrode 800, and a lower electrode 810.

The silicon substrate 100 is formed of a high-purity polycrystalline silicon material, and has a predetermined thickness. According to the embodiment, the silicon substrate 100 may have a thickness of 160 μm. One surface 100a and the other surface 100b of the silicon substrate 100 may be textured to form a concave-convex structure having a concave portion and a convex portion. The concave-convex structure may be formed by any one of plasma treatment of irradiating plasma, laser scribing of generating defects by adjusting a degree of energy, scratching of nicking with a fine tip, and an acid or base treatment.

The silicon substrate 100 is a first conductive type. The first conductive type has one of N-type semiconductor characteristics and P-type semiconductor characteristics. According to one embodiment, the silicon substrate 100 may have N-type semiconductor characteristics.

The emitter layer 200 may be formed on one surface of the silicon layer 100, and may be formed of a thin film having a predetermined thickness. The emitter layer 200 may be a second conductive type different from the first conductive type. According to one embodiment, the second conductive type has P-type characteristics. An interface between the silicon substrate 100 and the emitter layer 200 may be formed with a P-N junction, and when light is irradiated to the P-N junction, photovoltaic power is generated due to a photoelectric effect, and thus a current and a voltage are generated.

The anti-reflective layer 300 increases an amount of light reaching the silicon substrate 100 by reducing a reflectance of the sunlight incident on one surface of the silicon substrate 100. The anti-reflective layer 300 may be formed to make contact with one surface of the emitter layer 200, and may have a thickness of 10 nm.

The tunneling layer 400 may be formed on the other surface of the silicon layer 100, and may be formed of a thin film having a predetermined thickness. According to the embodiment, it is preferable that the tunneling layer 400 is formed of silicon oxide (SiOx) and has a thickness of 1 to 2 nm. When the thickness of the tunneling layer 400 is smaller than 1 nm, the possibility of pin-hole formation may increase, and thus surface recombination may increase, resulting in deterioration of characteristics of the TOPCon solar cell 10. When the thickness of the tunneling layer 400 is larger than 2 nm, the tunneling of electrons generated in the TOPCon solar cell 10 is restricted, and thus series resistance is greatly increased, resulting in deterioration of characteristics of the TOP Con solar cell 10. Therefore, according to the embodiment, the tunneling layer 400 may have a thickness of 1.5 mm.

The polycrystalline silicon layer 500 may be formed under the tunneling layer 400, and may be formed to have a predetermined thickness. The polycrystalline silicon layer 500 may have a thickness of 10 to 20 nm.

The polycrystalline germanium layer 600 may be positioned under the polycrystalline silicon layer 500, and the polycrystalline germanium layer 600 may be formed with a thickness that is larger than the thickness of the polycrystalline silicon layer 500. According to the embodiment, the polycrystalline germanium layer 600 may have a thickness of 80 to 100 nm.

The polycrystalline silicon layer 500 and the polycrystalline germanium layer 600 may be formed by plasma-enhanced chemical vapor deposition (PECVD).

The upper passivation layer 700 and the lower passivation layer 710 have a light transmittance that is greater than that of the anti-reflective layer 300, and are formed of a non-conductor.

The upper passivation layer 700 may be formed on the anti-reflective layer 300, and may be formed to have a predetermined thickness. The upper passivation layer 700 may have a thickness of 80 nm.

The lower passivation layer 710 may be formed under the polycrystalline germanium layer 600, and may be formed to have a predetermined thickness. The lower passivation layer 710 may have the same thickness as the upper passivation layer 700.

The upper passivation layer 700 and the lower passivation layer 710 have a light transmittance that is greater than that of the anti-reflective layer 300, and are formed of a non-conductor. The upper passivation layer 700 and the lower passivation layer 710 passivate defects present in a surface or bulk of the silicon substrate 100.

The upper electrode 800 may be formed on the upper passivation layer 700, and may be formed in a predetermined grid shape. The upper electrode 800 may be formed of silver (Ag). The upper electrode 800 is partially inserted into the emitter layer 200 by passing through the upper passivation layer 700 and the anti-reflective layer 300. A lower end of the upper electrode 800 is surrounded by the emitter layer 200 and is electrically connected to the emitter layer 200. When the upper electrode 800 is inserted into the emitter layer 200, resistance may not be increased, thereby obtaining an anti-reflection effect.

The lower electrode 810 may be formed on the lower passivation layer 710, and may be formed in a predetermined grid shape. The lower electrode 810 is partially inserted into the polycrystalline germanium layer 600 by passing through the lower passivation layer 710. The lower electrode 810 may be formed of silver (Ag). A lower end of the lower electrode 810 is surrounded by the polycrystalline germanium layer 600 and is electrically connected to the polycrystalline germanium layer 600.

The upper electrode 800 and the lower electrode 810 are electrically connected to an external power line, and transmit electricity generated by the TOPCon solar cell 10 to the outside.

Figure 2:
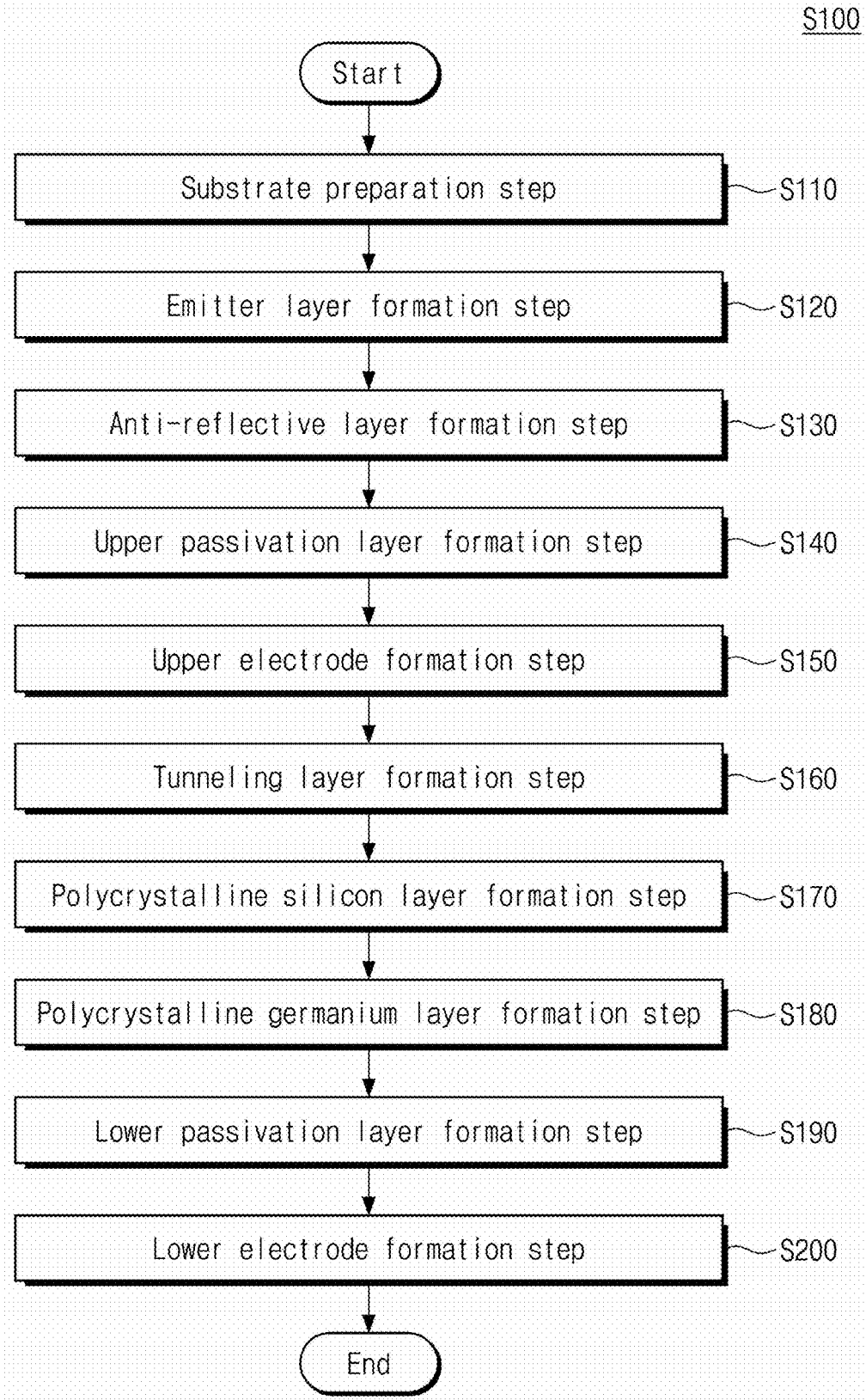
FIG. 2 is a flowchart showing a method for manufacturing a TOPCon solar cell according to one embodiment of the present disclosure.

FIG. 2 is a flowchart showing a method for manufacturing a TOPCon solar cell according to one embodiment of the present invention.

Referring to FIG. 2, a method S10 for manufacturing a TOPCon solar cell includes a substrate preparation step S110, an emitter layer formation step S120, an anti-reflective layer formation step S130, an upper passivation layer formation step S140, an upper electrode formation step S150, a tunneling layer formation step S160, a polycrystalline silicon layer formation step S170, a polycrystalline germanium layer formation step S180, a lower passivation layer formation step S190, and a lower electrode formation step S200.

In the substrate preparation step S110, a silicon substrate 100 is prepared. According to the embodiment, the silicon substrate 100 may be provided as an N-type polycrystalline silicon substrate having a thickness of 150 µm.

In the emitter layer formation step S120, an emitter layer 200 is formed on one surface of the silicon substrate 100. The emitter layer 200 may have N-type characteristics and P-type characteristics as different semiconductor characteristics to form a P-N junction of the silicon substrate 100. According to the embodiment, the emitter layer 200 has N-type characteristics. The emitter layer 200 may be doped with a pentavalent element such as phosphorus (P), arsenic (As), antimony (Sb), or the like.

In the anti-reflective layer formation step S130, an anti-reflective layer 300 is formed on one surface of the emitter layer 200. The anti-reflective layer 300 may be formed by a method such as chemical vapor deposition. The anti-reflective layer 300 may be formed of a transparent conductive oxide having a refractive index greater than that of air and less than that of the silicon substrate 100. According to one embodiment, the anti-reflective layer 300 may be formed of aluminum oxide (AlOx), but the present invention is not necessarily limited thereto.

In the upper passivation layer formation step S140, the upper passivation layer 700 is formed on one surface of the emitter layer 200 by a method such as chemical vapor deposition. The upper passivation layer 700 may be formed of any one material selected from oxide, silicon oxide (SiOx), and silicon nitride (SiNx). According to one embodiment, the upper passivation layer 700 may be formed of silicon nitride (SiNx).

In the upper electrode formation step S150, the upper electrode 800 is formed on the emitter layer 200. The upper electrode 800 may be formed through a thermal treatment process after applying electrode formation paste onto one surface of the emitter layer 200 in a predetermined pattern. According to the embodiment, silver (Ag) may be used as the electrode formation paste.

In the tunneling layer formation step S160, a tunneling layer 400 may be formed on the other surface of the silicon substrate 100. The tunneling layer 400 may be formed using any one of a thermal oxidation method, an electrochemical oxidation method, and a plasma-enhanced chemical vapor deposition (PECVD) method. According to the embodiment, the tunneling layer 400 is formed using a thermal oxidation method. The thermal oxidation method has an advantage in that defects are hardly generated at an interface between an inside of the tunneling layer 400 and the silicon substrate 100, and an insulating film having excellent characteristics may be formed. The thermal oxidation method includes a dry oxidation method or a wet oxidation method according to a type of gas used in an oxidation reaction. The dry oxidation method uses pure oxygen as a reaction gas, and the wet oxidation method uses a mixture of oxygen and water vapor.

In the polycrystalline silicon layer formation step S170, the polycrystalline silicon layer 500 is deposited on one surface of the tunneling layer 400. According to the embodiment, in the polycrystalline silicon layer formation step S170, the polycrystalline silicon layer 500 may be formed in a PECVD process, and the polycrystalline silicon layer 500 may be formed by supplying a first source gas under a constant temperature, power, and pressure. The first source may include monosilane ($SiH_4$), hydrogen ($H_2$), and phosphine ($PH_3$).

According to the embodiment, in the polycrystalline silicon layer formation step S170, a supply flow rate (Sccm), a temperature (° C.), power (W), and a process pressure (mT) of the first source gas, which are control conditions for forming the polycrystalline silicon layer 500, may be provided as shown in <Table 1>.

TABLE 1

| Monosilane (Sccm) | Hydrogen (Sccm) | Phosphine (Sccm) | Temperature (° C.) | Power (W) | Process pressure (mT) |
|---|---|---|---|---|---|
| 10 | 50 | 40 | 300 | 50 | 200 |

In the polycrystalline germanium layer formation step S180, the polycrystalline germanium layer 600 is deposited on one surface of the polycrystalline silicon layer 500. According to the embodiment, in the polycrystalline germanium layer formation step S180, the polycrystalline germanium layer 600 may be formed in a PECVD process, and the polycrystalline germanium layer 600 may be formed by supplying a second source gas under a constant temperature, power, and pressure. The polycrystalline germanium layer 600 may be completed through an additional thermal treatment process. The second source may include germane ($GeH_4$), hydrogen ($H_2$), and phosphine ($PH_3$) gas.

In the polycrystalline germanium layer formation step S180, a supply flow rate (Sccm), a temperature (° C.), power (W), and a process pressure (mT) of the first source gas, which are control conditions for forming the polycrystalline germanium layer 600, may be provided as shown in <Table 2>.

TABLE 2

| Germane (Sccm) | Hydrogen (Sccm) | Phosphine (Sccm) | Substrate temperature (° C.) | RF power (W) | Process pressure (mT) |
|---|---|---|---|---|---|
| 5 | 50 | 40 | 300 | 50 | 200 |

In the lower passivation layer formation step S190, the lower passivation layer 710 is deposited on one surface of the polycrystalline germanium layer 600. The lower passivation layer 710 may be formed to have the same thickness as the upper passivation layer 700 by a method such as chemical vapor deposition.

In the lower electrode formation step S200, the lower electrode 810 is formed on the polycrystalline germanium layer 600. The lower electrode 810 may be formed in the same manner as the step of forming the upper electrode 800.

Figure 3:
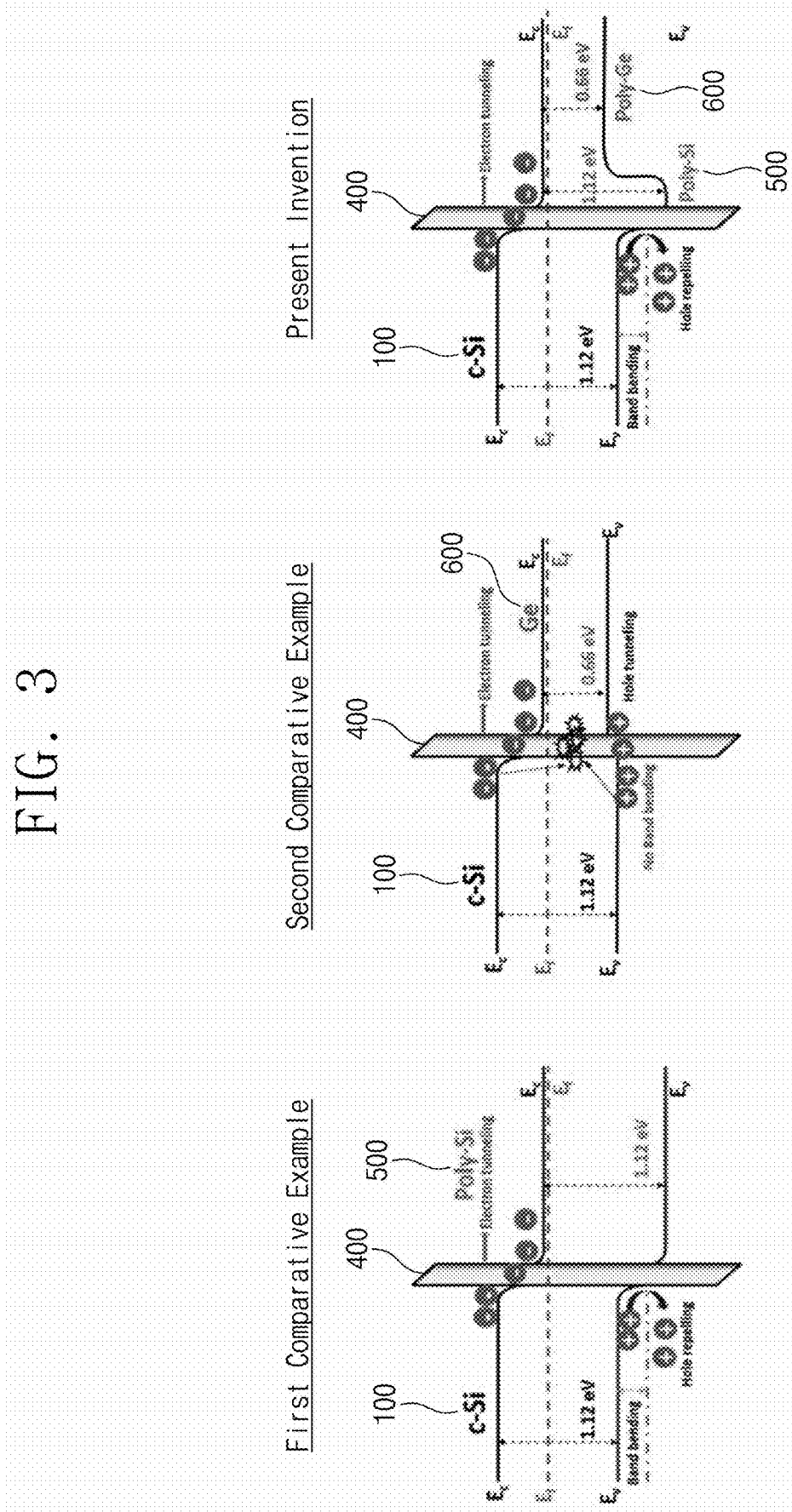
FIG. 3 is a view for explaining a band diagram of the TOPCon solar cell manufactured according to the embodiment of the present disclosure.

FIG. 3 is a view for explaining a band diagram of the TOPCon solar cell manufactured according to the embodiment of the present invention.

Referring to FIG. 3, a solar cell according to a first comparative example has a structure in which the tunneling layer 400, the polycrystalline silicon layer 500, and the lower passivation layer 710 are sequentially formed on a bottom surface of the silicon substrate 100, a solar cell according to a second comparative example has a structure in which the tunneling layer 400, the polycrystalline germanium layer 600, and the lower passivation layer 710 are sequentially formed on the bottom surface of the silicon substrate 100, and the TOPCon solar cell 10 according to the embodiment of the present invention has a structure in which the tunneling layer 400, the polycrystalline silicon layer 500, the polycrystalline germanium layer 600, and the lower passivation layer 710 are sequentially formed on the bottom surface of the silicon substrate 100.

In the solar cell according to the first comparative example, each of the silicon substrate 100 and the polycrystalline silicon layer 500 has a band gap of 1.12 eV. When light energy is incident from the sun, holes (+) and electrons (−) move from the silicon substrate 100, and the electrons move to the polycrystalline silicon layer 500 through the tunneling layer 400 by an electron tunneling effect. On the other hand, the holes may not pass through the tunneling layer 400 due to hole repelling caused by band bending between the silicon substrate 100 and the polycrystalline silicon layer 500.

In the solar cell according to the second comparative example, each of the silicon substrate 100 and the polycrystalline germanium layer 600 has a band gap of 0.66 eV. When light energy is incident from the sunlight, holes (+) and electrons (−) move from the silicon substrate 100. The electrons move to the polycrystalline silicon layer 500 by passing through the tunneling layer 400 due to the electron tunneling effect. In addition, the holes move to the polycrystalline germanium layer 600 by passing through the tunneling layer 400 without band bending between the silicon substrate 100 and the polycrystalline germanium layer 600.

In the solar cell according to the embodiment of the present invention, each of the silicon substrate 100 and the polycrystalline silicon layer 500 has a band gap of 1.12 eV, and the polycrystalline germanium layer 600 may have a band gap of 0.66 eV. When light energy is incident from the sunlight, holes (+) and electrons (−) move from the silicon substrate 100. The electrons sequentially move to the polycrystalline silicon layer 500 and the polycrystalline germanium layer 600 by passing through the tunneling layer 400 due to the electron tunneling effect. The holes may not pass through the tunneling layer 400 due to hole repelling caused by band bending between the silicon substrate 100 and the polycrystalline silicon layer 500.

The polycrystalline germanium layer 600 has a particle size that is relatively larger than that of the polycrystalline silicon layer 500, and has high electron mobility. Therefore, movement efficiency of electrons to the lower electrode 810 through the polycrystalline germanium layer 600 is improved.

As described above, the solar cell according to the embodiment of the present invention has the polycrystalline silicon layer 500 and the polycrystalline germanium layer 600 which are sequentially stacked on one surface of the tunneling layer 400, so that movement of holes is blocked and mobility of electrons is increased, thereby obtaining higher photoelectric efficiency as compared to the first and second comparative examples.

While the present invention has been described in connection with the embodiments, it is not to be limited thereto but will be defined by the appended claims. In addition, it is to be understood that those skilled in the art can substitute, change, or modify the embodiments in various forms without departing from the scope and spirit of the present invention.

DESCRIPTION OF REFERENCE NUMERALS

10: TOPCon solar cell
100: silicon substrate
200: emitter layer
300: anti-reflective layer
400: tunneling layer
500: polycrystalline silicon layer
600: polycrystalline germanium layer
700: upper passivation layer
710: lower passivation layer
800: upper electrode
810: lower electrode
S10 method for manufacturing TOPCon solar cell
S110 substrate preparation step
S120 emitter layer formation step
S130 anti-reflective layer formation step
S140 upper passivation layer formation step
S150 upper electrode formation step
S160 tunneling layer formation step
S170 polycrystalline silicon layer formation step
S180 polycrystalline germanium layer formation step
S190 lower passivation layer formation step
S200 lower electrode formation step

What is claimed is:

1. A Tunnel Oxide Passivated Contact (TOPCon) solar cell comprising:
   a silicon substrate;
   a tunneling layer formed on a surface of the silicon substrate;
   a polycrystalline silicon layer formed on a surface of the tunneling layer;
   a polycrystalline germanium layer formed on a surface of the polycrystalline silicon layer;
   a lower passivation layer formed on a surface of the polycrystalline germanium layer; and
   a lower electrode formed on the lower passivation layer and electrically connected to the polycrystalline germanium layer,
   wherein the polycrystalline silicon layer has a thickness of 10 to 20 nm, and
   wherein the polycrystalline germanium layer has a thickness of 80 to 100 nm.

2. The TOPCon solar cell of claim 1, wherein the polycrystalline silicon layer and the polycrystalline germanium layer are formed by plasma-enhanced chemical vapor deposition.

3. The TOPCon solar cell of claim 1, wherein the lower electrode is partially inserted into the polycrystalline germanium layer by passing through the lower passivation layer.

4. The TOPCon solar cell of claim 1, wherein the lower passivation layer comprises a light-transmissive material.

5. The TOPCon solar cell of claim 1, wherein the lower passivation layer passivates defects present in at least one of a surface of the silicon substrate, a bulk of the silicon substrate, or a combination thereof.

6. The TOPCon solar cell of claim 1, further comprising:
   an emitter layer formed on another surface of the silicon substrate;
   an anti-reflective layer formed on a surface of the emitter layer;
   an upper passivation layer formed on a surface of the anti-reflective layer; and
   an upper electrode formed on another surface of the upper passivation layer and having a predetermined grid shape.

7. The TOPCon solar cell of claim 6, wherein the upper electrode is partially inserted into the emitter layer by passing through the upper passivation layer and the anti-reflective layer.

8. The TOPCon solar cell of claim 6, wherein the upper passivation layer comprises a non-conductor having a light transmittance that is higher than a light transmittance of the anti-reflective layer.

9. The TOPCon solar cell of claim 1, wherein the polycrystalline silicon layer is formed by depositing a first source gas including at least one of monosilane, hydrogen, phosphine, or any combination thereof.

10. The TOPCon solar cell of claim 1, wherein the polycrystalline germanium layer is formed by depositing a second source gas including at least one of germane, hydrogen, phosphine, or any combination thereof.

11. A Tunnel Oxide Passivated Contact (TOPCon) solar cell comprising:
   a silicon substrate;
   a tunneling layer formed on a surface of the silicon substrate;
   an emitter layer formed on another surface of the silicon substrate;
   a polycrystalline silicon layer formed on a surface of the tunneling layer;
   an anti-reflective layer formed on a surface of the emitter layer;
   a polycrystalline germanium layer formed on a surface of the polycrystalline silicon layer;
   a lower passivation layer formed on a surface of the polycrystalline germanium layer;
   an upper passivation layer formed on a surface of the anti-reflective layer;
   a lower electrode formed on the lower passivation layer and electrically connected to the polycrystalline germanium layer; and
   an upper electrode formed on a surface of the upper passivation layer and having a predetermined grid shape,
   wherein the polycrystalline silicon layer has a thickness of 10 to 20 nm, and
   wherein the polycrystalline germanium layer has a thickness of 80 to 100 nm.

12. A method for manufacturing a Tunnel Oxide Passivated Contact (TOPCon) solar cell, the method comprising:
- preparing a silicon substrate;
- forming a tunneling layer on a surface of the silicon substrate;
- forming a polycrystalline silicon layer on a surface of the tunneling layer;
- forming a polycrystalline germanium layer on a surface of the polycrystalline silicon layer;
- forming a lower passivation layer on a surface of the polycrystalline germanium layer; and
- forming a lower electrode on a side of the lower passivation layer,
- wherein the lower electrode is electrically connected to the polycrystalline germanium layer,
- wherein the polycrystalline silicon layer has a thickness of 10 to 20 nm, and
- wherein the polycrystalline germanium layer has a thickness of 80 to 100 nm.

13. The method of claim 12, wherein in the forming of the polycrystalline silicon layer, the polycrystalline silicon layer is deposited on a surface of the tunneling layer by supplying a first source gas including at least one of monosilane, hydrogen, phosphine, or any combination thereof.

14. The method of claim 12, wherein in the forming of the polycrystalline germanium layer, the polycrystalline germanium layer is deposited on a surface of the polycrystalline silicon layer by supplying a second source gas including at least one of germane, hydrogen, phosphine, or any combination thereof.

* * * * *